United States Patent
Benzinger et al.

(10) Patent No.: US 6,556,486 B2
(45) Date of Patent: Apr. 29, 2003

(54) CIRCUIT CONFIGURATION AND METHOD FOR SYNCHRONIZATION

(75) Inventors: Herbert Benzinger, München (DE); Norbert Wirth, Unterschleissheim (DE); Ralf Schneider, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/998,725

(22) Filed: Nov. 30, 2001

(65) Prior Publication Data

US 2002/0071335 A1 Jun. 13, 2002

(30) Foreign Application Priority Data

Nov. 30, 2000 (DE) ........................................ 100 59 553

(51) Int. Cl.[7] .............................................. G11O 16/04
(52) U.S. Cl. ................... 365/189.05; 365/233; 365/220
(58) Field of Search ............................ 365/233, 289.05, 365/220

(56) References Cited

U.S. PATENT DOCUMENTS

| | | | | |
|---|---|---|---|---|
| 5,724,292 A | * | 3/1998 | Wada | .................... 365/207 |
| 6,163,832 A | * | 12/2000 | Okajima | ..................... 711/169 |
| 6,201,423 B1 | * | 3/2001 | Taguchi et al. | ............. 327/141 |
| 6,298,004 B1 | * | 10/2001 | Kawasaki et al. | .......... 365/233 |
| 6,438,063 B1 | * | 8/2002 | Lee | ....................... 365/230.03 |

FOREIGN PATENT DOCUMENTS

EP      0 225 025 A2      6/1987

* cited by examiner

*Primary Examiner*—Richard Elms
*Assistant Examiner*—Tuan T. Nguyen
(74) *Attorney, Agent, or Firm*—Laurence A. Greenberg; Werner H. Stemer; Ralph E. Locher

(57) ABSTRACT

A circuit configuration and a method for the synchronization of signals include transmitting signals in parallel through data lines and buffer-storing the signals in a synchronizing unit. A clock signal is determined from the signals of a data line and is used for synchronizing the outputting of the signals. The signals are output in the order in which the signals were read. The signals are likewise output through a plurality of data lines, the signals being output temporally synchronously. Propagation time differences are compensated due to the buffer-storage. Moreover, the clock signal is determined from the signals themselves. Consequently, the use of an additional clock signal is not necessary.

17 Claims, 2 Drawing Sheets

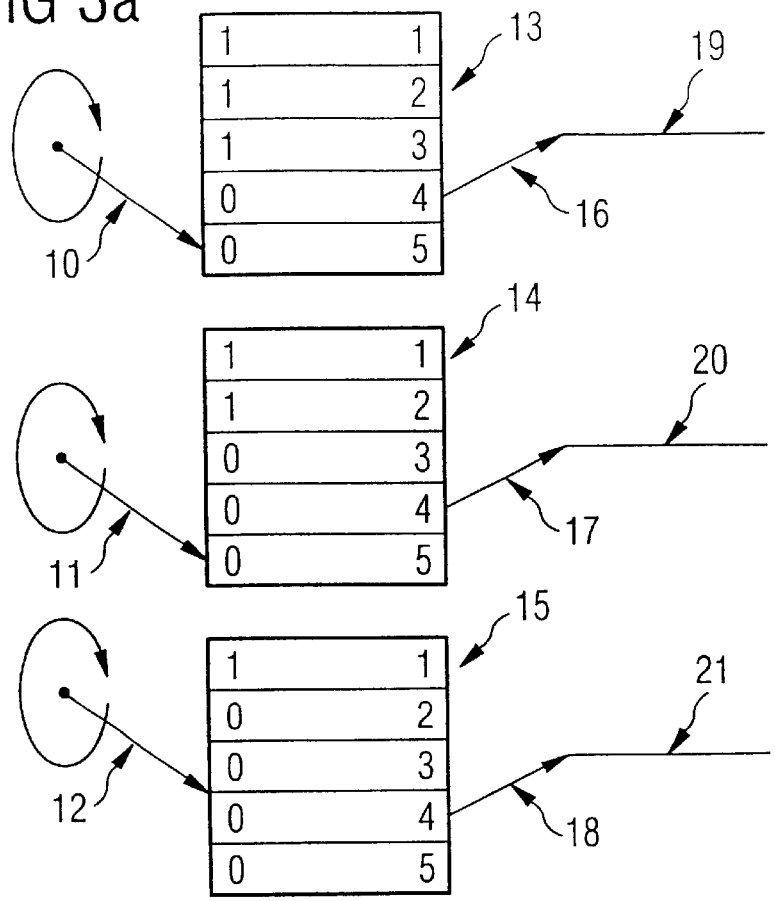

CIRCUIT CONFIGURATION AND METHOD FOR SYNCHRONIZATION

BACKGROUND OF THE INVENTION

Field of the Invention

The invention relates to a circuit configuration having a memory with an input unit having inputs through which data are fed in parallel and stored in the memory, and an output unit with outputs. The output unit outputs data through the outputs after buffer-storage, and to a method for the synchronization of data that is output through a plurality of data lines in the form of data groups in parallel according to a defined order. The data for each data line is stored in a buffer memory through an input in a storage operation within a time window.

In circuit configurations such as, e.g., memory modules, signals are exchanged in parallel through a plurality of signal lines. During the exchange of the signals, it is necessary, particularly in the case of fast signal transmission methods, to achieve precise synchronization of the signals. In such a case, however, it must be taken into account that the signals on different lines may have propagation times of different lengths. Due to these effects, a common maximum clock frequency is limited because a receiver additionally always requires a minimum of setup time and hold time. In the case of prior art interfaces such as, e.g., Rambus, Synclink, Double Data Rate SDRAMs, etc., clock signals are always concomitantly transmitted in addition to the signals. All of the other control, address, and data signals must be synchronized with these clock signals.

The prior art method is relatively complicated because a separate clock signal has to be transmitted.

SUMMARY OF THE INVENTION

It is accordingly an object of the invention to provide a circuit configuration and method for synchronization that overcomes the hereinafore-mentioned disadvantages of the heretofore-known devices and methods of this general type and that enables transmission of data in the form of signals without a separate clock signal being transmitted.

With the foregoing and other objects in view, there is provided, in accordance with the invention, a circuit configuration including a buffer memory having memory arrays each with memory cells, an input unit connected to the memory and having inputs through which data is fed in parallel at a given time clock and stored in the memory and input pointers each associated with the memory and each to be controlled by a clock signal, an output unit connected to the memory and having outputs, the output unit outputting data through the outputs after buffer-storage in the memory, and a detection unit connected to the input unit and to the input pointers. Each of the input pointers, under control of the clock signal, is connected to a respective one of the memory arrays for a predetermined time period. Each of the input pointers reads a datum present at one of the inputs into a respective one of the memory cells. Each of the input pointers change, after the predetermined time period has elapsed, to another one of the memory arrays. The detection unit determines, from the data fed in, the given time clock with which the data are fed in. The detection unit feeds to the input pointers the clock signal dependent on the given time clock determined.

One advantage of the invention is that a clock signal is derived from the transmitted data and the signals are stored synchronously with the derived clock signal. As such, precise tuning of the storage time is possible. A precise and short detection time becomes possible as a result.

A further advantage of the invention is that the data are buffer-stored and are output temporally synchronously according to a predetermined order. As such, it is possible to compensate propagation time differences exhibited by the data between a transmitter and the inputs.

Signals that are synchronized according to a common clock signal are available. As a result, the signals can be precisely detected and processed further. Moreover, shorter time windows suffice to be able to detect the signals precisely.

In accordance with another feature of the invention, each of the input pointers has an input, the detection unit is connected to each input of the input pointers, the detection unit determines, for each input of the input pointers, a clock signal with which the data is fed thereto, and the input unit determines, for each of the input pointers, a clock signal derived therefrom and feeds the clock signal to a respective one of the input pointers.

In accordance with a further feature of the invention, the detection unit is connected to the output unit, the detection unit forwards to the output unit a time clock synchronous with the given time clock, and the output unit outputs the data in parallel through the outputs according to the synchronous time clock.

It is advantageous that the detection unit, for each input pointer, determines an individual clock signal and feeds it to the input pointer. The individual clock signal is preferably determined from the data fed through the input of the corresponding input pointer. Very precise control of the input pointers is, thus, possible.

In accordance with an added feature of the invention, the detection unit has a clock input for receiving a second clock signal, the detection unit determines, from the given time clock, a temporally shifted time clock, preferably, lying in a time window defined by the second clock signal, the detection unit passes the shifted time clock to the output unit, and the output unit outputs the data according to the shifted time clock.

The detected time clock is preferably shifted temporally in a manner dependent on a second time clock, so that the signals preferably lie centrally in a predetermined time window. As such, the further processing of the signals is improved, moreover, because the signals that lie centrally in the time window can be detected very precisely. Thus, temporal shifts of the signals on the time axis, which are produced by interfering influences, can be compensated more easily.

In accordance with an additional feature of the invention, the input pointers are respectively connected to one of the inputs, the output unit has an output pointer for each of the outputs; each of the inputs is assigned to a respective one of the outputs, and each of the output pointers respectively outputs the data from the memory arrays at each of the outputs in an order in which the data were written through an assigned one of the inputs.

A respective input of the circuit configuration is assigned to an output and memory arrays are provided between the input and the output, which memory arrays are read in the manner in which the signals were written to the memory arrays. The process ensures that signals are output in the order in which the signals were written. Consequently, a correct order of the signals is ensured despite the buffer-storage.

In accordance with yet another feature of the invention, output pointers are controlled by the time clock that is fed the output unit by the detection unit. Consequently, the output pointers output the data synchronously with the time clock of the detection unit.

In accordance with yet a further feature of the invention, the output unit has an output pointer for each of the outputs, one of the inputs is assigned to a respective one of the outputs through the memory; each output pointer outputs the data from the memory arrays at a respective one of the outputs in an order in which the data was written through each assigned one of the inputs, a controller has output lines connected to the inputs, data is output, from the controller, in parallel in the form of data groups in a first order and according to a first time clock, and the output pointers are synchronized such that, after buffer-storage in the memory, the data is output again through the outputs in the same data groups and in the first order. As such, the data structure of the data is retained despite the buffer-storage.

In accordance with yet an added feature of the invention, the outputs of a circuit unit are preferably connected directly to a processing unit and the processing unit is programmed to process the data in an order in which the data is output from the controller. Consequently, the signals ordered according to a common clock are fed directly to a processing unit. The embodiment affords the advantage that data is transmitted in parallel and is synchronized directly at a processing unit according to a clock signal that has been determined from the signals themselves. Consequently, the signals are present in a temporally precise form and order in the processing unit. Fast and precise processing of the signals in the processing unit is, thus, possible.

With the objects of the invention in view, there is also provided a method for synchronizing data, including the steps of outputting data through data lines in the form of data groups in parallel according to a defined order, storing the data for each data line in buffer memories through an input in a storage operation within a time window, detecting a time clock with which data is fed to the input for each data line, and adapting a temporal position of the time window for a storage operation to the detected time clock.

In accordance with yet an additional mode of the invention, the temporal position of the time window individually adapted for each data line.

In accordance with again another mode of the invention, after the buffer-storage, the data is output synchronously again in the form of data groups in parallel through second data lines according to the defined order.

In accordance with again a further mode of the invention, orders of the data in which the data is stored in the buffer memories are determined for each data line in a test mode, and, from the orders determined, an order is defined with which the data is output from the buffer memories in the defined order.

In accordance with again an added mode of the invention, the data is output synchronously with the detected time clock in a manner temporally shifted with respect to the detected time clock, the temporal shift being defined such that a datum is disposed in the predetermined time window. Preferably, the datum is disposed centrally with respect to the predetermined time window.

With the objects of the invention in view, there is also provided a method for synchronizing data including the steps of providing a buffer memory having memory arrays each with memory cells, connecting an input unit and an output unit to the memory, associating input pointers with the memory, connecting a detection unit to the input unit and to the input pointers, feeding in data in parallel based upon a given time clock to inputs of the input unit, determining the given time clock with the detection unit based upon the data fed to the inputs, feeding, with the detection unit, a clock signal to the input pointers dependent on the given time clock determined, connecting, for a predetermined time period, each of the input pointers to a respective one of the memory arrays under control of the clock signal, reading, with each of the input pointers, a datum present at one of the inputs into a respective one of the memory cells, changing, after the predetermined time period has elapsed, each of the input pointers to another one of the memory arrays, and outputting synchronized data through outputs of an output unit after buffer-storage in the memory.

Other features that are considered as characteristic for the invention are set forth in the appended claims.

Although the invention is illustrated and described herein as embodied in a circuit configuration and method for synchronization, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 3a is a block circuit diagram of synchronization of the output pointers according to the invention; and FIGS. 3b and 3c are data flow diagrams shows synchronization of the output pointers according to the invention.

DESCRIPTION OF THE PREFERRED EMBODIMENTS

Figure 1:
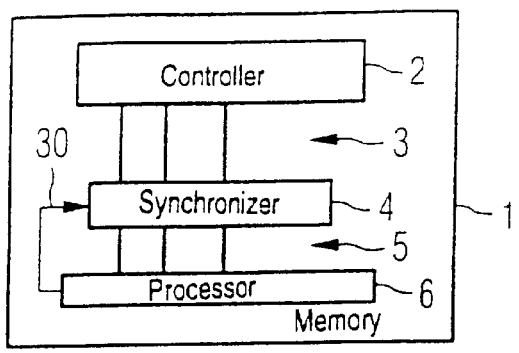
FIG. 1 is a block circuit diagram of a memory module according to the invention.

As an area of use for the circuit configuration according to the invention, reference is made to the figures of the drawings in detail and first, particularly to FIG. 1 thereof, where there is shown a memory module 1 that is fabricated from a semiconductor material, for example. However, the circuit configuration according to the invention can be used in any kind of circuit in which data is transmitted in parallel through a plurality of data channels and is intended to be precisely detected and processed by a processing unit.

The memory module 1 has an integrated circuit with a controller 2, a synchronizing unit 4, and a processing unit 6. By way of example, an address decoder, an amplifier circuit for writing in or for reading out data from a memory cell, or a control unit is provided as the processing unit 6. A memory module 1 has a multiplicity of components and electronic circuits, but these are not explicitly illustrated for reasons of clarity.

The controller 2 is connected to the synchronizing unit 4 through three first data lines 3. The synchronizing unit 4 is connected to the processing unit 6 through three second data lines 5. The controller 2 transmits data in the form of signals in parallel through the first data lines 3. The signals are preferably output simultaneously through the three first data lines 3. In a simplified embodiment, although the signals are output in a defined order through the first data lines 3, synchronization of simultaneous outputting of signals through the first data lines 3 is not necessary.

The synchronizing unit 4 receives the signals transmitted in parallel through the first data lines 3 and buffer-stores the signals in a memory and outputs the signals in a defined manner through the second data lines 5 to the processing unit 6. The synchronizing unit 4 synchronizes the signals with one another during the outputting, so that the signals arrive at the processing unit 6 preferably simultaneously at a precise point in time. The processing unit 6 detects the signals fed in and processes the signals further depending on the embodiment of the processing unit 6. By way of example, the processing unit 6 may also be formed in a command decoding device that decodes and forwards control commands based upon the signals fed in. In a preferred embodiment, the processing unit 6 is connected to the synchronizing unit 4 through a clock line 30.

Figure 2:
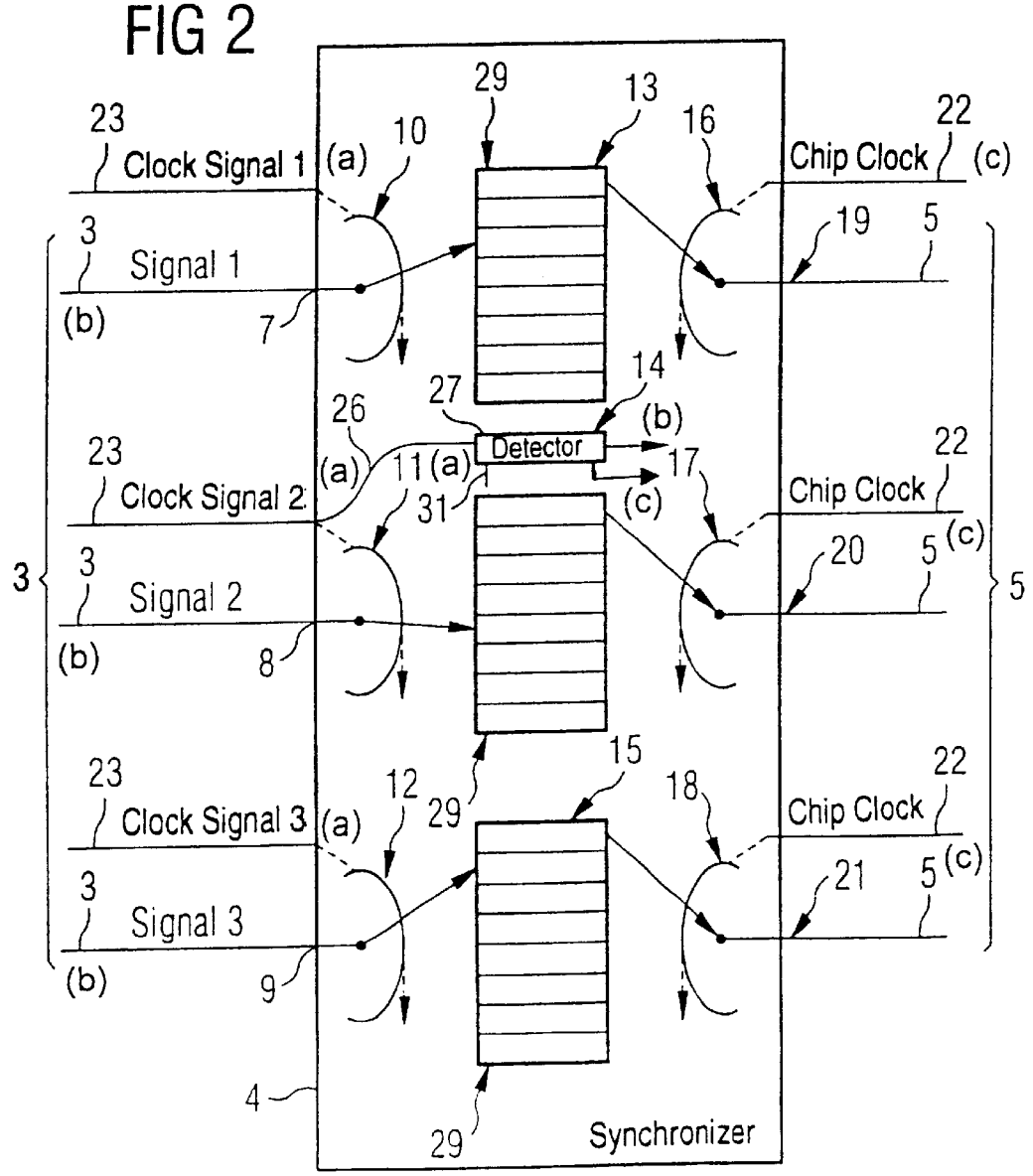
FIG. 2 is a block circuit diagram of a synchronizing unit of FIG. 1.

The method of operation of the synchronizing unit 4 is explained in more detail below with reference to FIG. 2. FIG. 2 shows the synchronizing unit 4, which has a first, second, and third input 7, 8, 9, to which the three first signal lines 3 are connected. A respective signal line 3 is connected to each input 7, 8, 9. The first input 7 is connected to a first input pointer 10, the second input 8 is connected to a second input pointer 11, and the third input 9 is connected to a third input pointer 12. The first, second, and third input pointers 10, 11, 12 are respectively passed to a first memory 13, second memory 14, and third memory 15. An input pointer is a switching element that is controlled by a clock signal and establishes a connection between an input and a memory array of the first, second, or third memory 13, 14, 15 in each case for a clock time. Consequently, the signal that is present at the input 7, 8, 9 is written to the memory array to which the corresponding input pointer 10, 11, 12 points.

The first, second and third input pointers 10, 11, 12 in each case have a clock input 23. At least one clock input 23 is connected to a detection unit 27, which is additionally connected to at least one input 7, 8, 9. Connectivity between the clock input 23 and the detection unit 27 is illustrated in FIG. 2 by the symbol "(a)". The detection unit 27 is configured such that the detection unit 27 determines, from the signals that are fed through an input 7, 8, 9, the time clock according to which the signals are fed in. The detection unit 27 passes the determined time clock to the clock inputs 23. Such connectivity is illustrated in FIG. 2 by the symbol "(b)". Consequently, the input pointers 10, 11, 12 are controlled by a time clock that has been determined by the detection unit 27. As a result, the input pointers 10, 11, 12 advance to the next memory array 29 synchronously with one another in a manner dependent on the time clock with which signals are fed to an input 7, 8, 9, so that a change of the memory arrays to which the first, second, and third input pointer 10, 11, 12 respectively writes are changed simultaneously. In such a case, however, it is possible for the input pointers to have a phase shift of at least one time clock with respect to one another. By way of example, the first input pointer 10 may point to the third memory array of the first memory and the second input pointer 11 may point to the fifth memory array of the second memory 14, as is illustrated in FIG. 2. The first, second, and third memories 13, 14, 15 are configured as first-in/first-out memories and realized in the form of a ring memory, for example.

In a development of the invention, the detection unit 27 is connected to the first, second and third inputs 7, 8, 9 and determines the clock signals with which signals are fed to the first input 7, the second input 8, and the third input 9. The clock signal of the first, second, and third inputs 7, 8, 9 is respectively fed to the first, second, and third input pointers 10, 11, 12. As such, each input pointer 10, 11, 12 is respectively switched according to the clock signal that corresponds to the clock signal with which the signals are fed to the input of the corresponding input pointer 10, 11, 12. In the case of such clock control, too, the input pointers 10, 11, 12 may have a phase shift relative to one another.

Furthermore, three output pointers 16, 17, 18 are provided. Each output pointer 16, 17, 18 is associated with a respective memory 13, 14, 15. The output pointers 16, 17, 18 function in accordance with the input pointers and connect a memory array to an associated first, second, and third output 19, 20, 21, respectively. The output pointers 16, 17, 18 have a second clock input 22, through which a clock signal is fed, according to which the output pointers 16, 17, 18 in each case jump to the next memory array of the first, second, and third memories 13, 14, 15, respectively. In the illustration, the first, second, and third output pointers 16, 17, 18 are respectively connected to the topmost memory array of the first, second, and third memories 13, 14, 15, the first output pointer 16 being connected to a first output 19, the second output pointer 17 being connected to a second output 20, and the third output pointer 18 being connected to a third output 21. If a clock signal is fed to the output pointers 16, 17, 18 through the clock input 22, then the first, second, and third output pointers 16, 17, 18 simultaneously jump to the next memory array of the first, second, and third memories 13, 14, 15, respectively. Synchronous outputting of the signals that are written in the first, second, and third memories 13, 14, 15 is, thus, achieved. The clock input 22 is connected, for example, to a clock generator that prescribes a chip clock.

In a preferred embodiment, the clock input 22 is connected to the detection unit 27, which prescribes the clock signal for the output pointers 16, 17, 18. Such connectivity is illustrated in FIG. 2 by the symbol "(c)". In a first embodiment, the detection unit 27 selects one of the clock signals, with which signals are fed to the first, second, or third input 7, 8, 9, and forwards the clock signal to the second clock input 22 of the output pointers 16, 17, 18. Consequently, in the embodiment, the output pointers are switched in accordance with a clock signal of an input pointer 10, 11, 12.

The other input pointers can be switched with another clock signal. Consequently, the output pointers 16, 17, 18 are synchronized only according to the input signal of one of the three inputs 7, 8, 9. What is achieved in this way is that signals are read out simultaneously through the first, second, and third outputs 19, 20, 21, even though the signals were read into the first, second, and third memories 13, 14, 15 in a temporally shifted manner through the first, second, and third inputs 7, 8, 9.

The process requires the first input pointer 10 to lead the first output pointer 16, the second input pointer 11 to lead the second output pointer 17, and the third input pointer 12 to lead the third output pointer 18 at least by one memory array. Leading is given in the embodiment illustrated in FIG. 2, the pointers in each case traversing the individual memory arrays 29 of the first, second, and third memories 13, 14, 15 respectively, from top to bottom. The first input pointer 10 leads the first output pointer 16 by two memory arrays 29, the second input pointer 11 leads the second output pointer 17 by four memory arrays, and the third input pointer 12 leads the third output pointer 18 by one memory array. It is, thus, ensured that the signals can be read in in parallel through the inputs 7, 8, 9 in a manner temporally shifted relative to one another and, after a defined storage time, are read out simultaneously from the first, second, and third memories 13, 14, 15 through the first, second, and third outputs 19, 20, 21, respectively.

In the exemplary embodiment illustrated, in which the third input pointer 12 has only one clock difference with respect to the third output pointer 18, the signals that are written in parallel through the inputs 7, 8, 9 to the first, second, and third memories 13, 14, 15, respectively, are permitted to be temporally shifted relative to one another only by less than one clock period. If the intention is to permit a longer temporal interval between the signals during inputting into the memories 13, 14, 15, then it is necessary to choose a greater separation between the third input pointer 12 and the third output pointer 18. By way of example, the separations between the input pointer and the associated output pointer may be fixed at three memory arrays 29. As a result, it is allowed for the signals at the three inputs 7, 8, 9 to have a time difference of up to two clock times and, nevertheless, still be output simultaneously through the outputs 19, 20, 21.

In a development of the invention, the detection unit 27 is connected by a second clock output to the second clock inputs 22 of the output pointers 16, 17, 18, and by a first clock output to the first clock inputs 23 of the input pointers 10, 11, 12. In such a case, the output pointers 16, 17, 18 have an adjustable phase difference with respect to one another of at least one time clock of the clock signal with which the output pointers 16, 17, 18 are driven. Accordingly, the input pointers 10, 11, 12 can be synchronized by phase differences less than or greater than a time clock of a clock signal with respect to one another, in which case the output pointers can be shifted by whole multiples of a time clock of the clock signal and synchronized.

A preferred embodiment of the invention lies in the fact that a clock signal is fed from the processing unit 6 to the synchronizing unit 4 through a clock line 30. The clock signal is fed to the detection unit 27 through a third clock input 31. The detection unit 27 uses the reference clock fed through the clock line 30 to temporally shift the clock signal determined from the signals fed through the inputs 7, 8, 9 and, thus, obtain a shifted clock signal. The shifted clock signal is fed to the clock inputs 22 of the output pointers 16, 17, 18. The shifted clock signal is formed such that the signals that are output through the outputs 19, 20, 21 lie in a predetermined time window. The predetermined time window corresponds, for example, to a detection time with which signals from the processing unit 6 are detected on the second data lines 5. The precise synchronization of the output pointers 16, 17, 18 with the time window makes it possible to reduce the time window or, given time windows of the same size, to obtain a reduced susceptibility to interference as a result of propagation time differences between the signals. The synchronizing unit 4 is preferably integrated in a processing unit 6 or at least connected to the processing unit 6 only through short second data lines 5. The configuration prevents propagation time differences from again occurring between the signals of the different outputs 19, 20, 21.

FIG. 3a diagrammatically shows a synchronization operation, during which the output pointers 16, 17, 18 are synchronized with one another such that the signals that are output simultaneously from the controller 2 onto the first data lines 3 are in each case synchronous again downstream of the synchronizing unit 4 and are output simultaneously through the outputs 19, 20, 21. To that end, the controller 2 transmits a sequence of numbers simultaneously to all the inputs 7, 8, 9, the sequence having firstly the signal sequence 111 and then the signal sequence 000. The controller 2 outputs a signal through all three first data lines 3 simultaneously in each case. Due to propagation time differences between the signals through the three first data lines 3, the input pointers 10, 11, 12 are directed at different memory arrays 29 of the first, second, and third memories 13, 14, 15, respectively. The signals are written in accordance with their serial inputting to the memory arrays 29 of the first, second, and third memories 13, 14, 15. FIG. 3a illustrates the serial signal sequence on the left-hand side on the memory arrays 29 of the first, second, and third memories 13, 14, 15, from top to bottom. The input pointers 10, 11, 12 read the signals from top to bottom into the memory arrays 29 and begin at the top again in the topmost memory array. A closed circle with arrow direction indicates the order of the storage operations. It can be seen that the change from the number one to the number zero takes place at different memory arrays in the different memories 13, 14, 15. The ordinal number of the respective memory array 29 is specified on the right-hand side. By way of example, the transition takes place from the third to the fourth memory array 29 in the first memory 13, from the second to the third memory array 29 in the second memory 14, and from the first to the second memory array 29 in the third memory 15. The output pointers 16, 17, 18 are set such that the output pointers in each case connect the memory array 29 to the corresponding output 19, 20, 21 in which the first zero is stored. Consequently, the output pointers are synchronized with one another and the data are output simultaneously through the outputs 19, 20, 21, which data was also output simultaneously by the controller 2 through the first data lines 3. Propagation time differences that occur on the first data lines 3 are, thus, compensated.

FIG. 3b shows the serial data stream that is fed to the first, second, and third inputs 7, 8, 9 through the signals from the controller 2. The signals are stored in the first, second, and third memories 13, 14, 15, which signals are identified in the form of a border.

FIG. 3c shows the serial data stream that is output simultaneously by the controller 2 through the three first data lines 3. FIG. 3c reveals that the transition from the number one to the number zero is output simultaneously by the controller 2 through all three first data lines. Due to propagation time differences, however, the signals are shifted on their way to the synchronizing unit 4, so that the signals are present at the inputs 7, 8, 9 in the temporal assignment in accordance with FIG. 3b. The signals at the second input are shifted by one time clock relative to the signals of the third input 9. The signals of the first input 7 are again shifted by one time clock relative to the signals of the second input 8.

These propagation time differences are compensated by the corresponding synchronization of the output pointers.

In another embodiment of the synchronization, by way of example, the output pointers 16, 17, 18 are positioned respectively to the same memory array of a memory 13, 14, 15 and the order of the output signals is adapted to the order of the outputting of the signals by the controller 2 by the input pointers 10, 11, 12 being positioned to corresponding memory arrays. Synchronization of the signals output in parallel by the controller 2 is achieved by coordination between the input pointers 10, 11, 12 and the output pointers 16, 17, 18 through the buffer-storage in the memories 13, 14, 15.

We claim:

1. A circuit configuration, comprising:

a buffer memory having memory arrays each with memory cells;

an input unit connected to said memory and having:
inputs through which data is fed in parallel at a given time clock and stored in said memory; and
input pointers each associated with said memory and each to be controlled by a clock signal;

an output unit connected to said memory and having outputs, said output unit outputting data through said outputs after buffer-storage in said memory;

a detection unit connected to said input unit and to said input pointers;

each of said input pointers, under control of the clock signal, connected to a respective one of said memory arrays for a predetermined time period;

each of said input pointers reading a datum present at one of said inputs into a respective one of said memory cells;

each of said input pointers changing, after the predetermined time period has elapsed, to another one of said memory arrays;

said detection unit determining, from the data fed in, the given time clock with which the data are fed in; and said detection unit feeding to said input pointers the clock signal dependent on the given time clock determined.

2. The circuit configuration according to claim 1, wherein:

each of said input pointers has an input;

said detection unit is connected to each input of said input pointers;

said detection unit determines, for each input of said input pointers, a clock signal with which the data is fed thereto; and said input unit determines, for each of said input pointers, a clock signal derived therefrom and feeds the clock signal to a respective one of said input pointers.

3. The circuit configuration according to claim 2, wherein:

said detection unit is connected to said output unit;

said detection unit forwards to said output unit a time clock synchronous with the given time clock; and said output unit outputs the data in parallel through said outputs according to said synchronous time clock.

4. The circuit configuration according to claim 3, wherein:

said detection unit has a clock input for receiving a second clock signal;

said detection unit determines, from the given time clock, a temporally shifted time clock;

said detection unit passes said shifted time clock to said output unit; and said output unit outputs the data according to said shifted time clock.

5. The circuit configuration according to claim 4, wherein said detection unit determines, from the given time clock, a temporally shifted time clock lying in a time window defined by the second clock signal.

6. The circuit configuration according to claim 4, wherein:

said input pointers are respectively connected to one of said inputs;

said output unit has an output pointer for each of said outputs;

each of said inputs is assigned to a respective one of said outputs; and each of said output pointers respectively outputs the data from said memory arrays at each of said outputs in an order in which the data were written through an assigned one of said inputs.

7. The circuit configuration according to claim 6, wherein:

said output pointers are controlled by said shifted time clock fed to said output unit by said detection unit; and said output pointers each output the data synchronously with said shifted time clock.

8. The circuit configuration according to claim 1, wherein:

said output unit has an output pointer for each of said outputs;

one of said inputs is assigned to a respective one of said outputs through said memory;

each output pointer outputs the data from said memory arrays at a respective one of said outputs in an order in which the data was written through each assigned one of said inputs;

a controller has output lines connected to said inputs;

data is output, from the controller, in parallel in the form of data groups in a first order and according to a first time clock; and said output pointers are synchronized such that, after buffer-storage in said memory, the data is output again through said outputs in the same data groups and in the first order.

9. The circuit configuration according to claim 8, including a processing unit having inputs, said outputs are connected to said inputs of said processing unit, said processing unit is programmed to process the data in an order in which the data is output from said controller.

10. A method for synchronizing data, which comprises:

outputting data through data lines in the form of data groups in parallel according to a defined order;

storing the data for each data line in buffer memories through an input in a storage operation within a time window;

detecting a time clock with which data is fed to the input for each data line; and adapting a temporal position of the time window for a storage operation to the detected time clock.

11. The method according to claim 10, which further comprises individually adapting the temporal position of the time window for each data line.

12. The method according to claim 10, which further comprises, after the buffer-storage, outputting the data synchronously again in the form of data groups in parallel through second data lines according to the defined order.

13. The method according to claim 11, which further comprises, after the buffer-storage, outputting the data synchronously again in the form of data groups in parallel through second data lines according to the defined order.

14. The method according to claim 12, which comprises:

determining orders of the data in which the data is stored in the buffer memories for each data line in a test mode; and from the orders determined, defining an order with which the data is output from the buffer memories in the defined order.

15. The method according to claim 10, which further comprises outputting the data synchronously with the detected time clock in a manner temporally shifted with respect to the detected time clock, the temporal shift being defined such that a datum is disposed in the predetermined time window.

16. The method according to claim 11, which further comprises outputting the data synchronously with the detected time clock in a manner temporally shifted with respect to the detected time clock, the temporal shift being defined such that a datum is disposed centrally with respect to the predetermined time window.

17. A method for synchronizing data, which comprises:

providing a buffer memory having memory arrays each with memory cells;

connecting an input unit and an output unit to the memory; associating input pointers with the memory;

connecting a detection unit to the input unit and to the input pointers;

feeding in data in parallel based upon a given time clock to inputs of the input unit;

determining the given time clock with the detection unit based upon the data fed to the inputs;

feeding, with the detection unit, a clock signal to the input pointers dependent on the given time clock determined;

connecting, for a predetermined time period, each of the input pointers to a respective one of the memory arrays under control of the clock signal;

reading, with each of the input pointers, a datum present at one of the inputs into a respective one of the memory cells;

changing, after the predetermined time period has elapsed, each of the input pointers to another one of the memory arrays; and outputting synchronized data through outputs of an output unit after buffer-storage in the memory.

* * * * *